United States Patent [19]
Lin et al.

[11] Patent Number: 5,376,585
[45] Date of Patent: Dec. 27, 1994

[54] METHOD FOR FORMING TITANIUM TUNGSTEN LOCAL INTERCONNECT FOR INTEGRATED CIRCUITS

[75] Inventors: Johnson J. Lin, Plano; David R. Wyke, Carrollton, both of Tex.

[73] Assignee: Texas Instruments Incorporated, Dallas, Tex.

[21] Appl. No.: 951,683

[22] Filed: Sep. 25, 1992

[51] Int. Cl.⁵ ............................................. H01L 21/44
[52] U.S. Cl. .................................... 437/192; 437/228
[58] Field of Search ..................... 437/192, 228, 200

[56] References Cited

U.S. PATENT DOCUMENTS

| | | | |
|---|---|---|---|
| 4,267,012 | 5/1981 | Pierce et al. | 437/192 |
| 4,787,958 | 11/1988 | Lytle | 437/192 |
| 5,024,722 | 6/1991 | Cathey, Jr. | 156/643 |
| 5,100,505 | 3/1992 | Cathey, Jr. | 156/659.1 |
| 5,141,897 | 8/1992 | Manocha et al. | 437/228 |
| 5,164,331 | 11/1992 | Lin et al. | 437/200 |
| 5,231,055 | 7/1993 | Smith | 437/192 |

OTHER PUBLICATIONS

S. Wolf, Silicon Processing for the VLSI Era, vol. 2. (1990) Lattice Press, p. 192.
S. K. Ghandi, VLSI Fabrication Principles, (1983). John Wiley & Sons. p. 502.
Rob Wolters, "The Feasiblity of CoSi$_2$, TiW and TiW(N) As Local Interconnection in a Self-Aligned CoSi2 Technology" Jun. 13–14, 1988, V–MIC Conf. 1988 IEEE.

Primary Examiner—Olik Chaudhuri
Assistant Examiner—C. Everhart
Attorney, Agent, or Firm—Christopher L. Maginniss; W. James Brady, III; Richard L. Donaldson

[57] ABSTRACT

A method and structure for a titanium tungsten (TiW)-/tungsten local interconnect (136) for cells (100) of semiconductor device includes steps and structure resulting from sputtering a titanium tungsten (TiW) layer (128) on semiconductor structure (100) and then forming a tungsten layer over the TiW layer (128). Then, the method is to pattern a layer of resistive polymer (32) such as photoresist in a predetermined lithographic pattern over the structure (100). This forms the local interconnect (136) from the TiW layer (128). Then, by dry etching, the process removes exposed portions of the tungsten and TiW layers. A wet strip process removes resistive polymer (32) from the semiconductor structure (100) to yield TiW/tungsten interconnect (136) for the semiconductor structure (100). Alternatively a single TiW layer is used in which exposed portions of the TiW layer are removed by a wet etch.

9 Claims, 1 Drawing Sheet

METHOD FOR FORMING TITANIUM TUNGSTEN LOCAL INTERCONNECT FOR INTEGRATED CIRCUITS

TECHNICAL FIELD OF THE INVENTION

The present invention generally relates to electronic circuitry and more particularly to a titanium tungsten local interconnect for an integrated circuit and method for fabricating the local interconnect.

BACKGROUND OF THE INVENTION

Modern ultra large-scale integrated circuit (ULSI) chips incorporate large numbers of SRAM cache tag memories that enhance the speed of systems using the chips. The physical size of the cells that make up the SRAM cache tag memories often determines the density and performance of the chips. As such, smaller, more SRAM dense cache tag memories exhibit better performance characteristics. The most effective method to achieve a small cell for a SRAM cache tag memory is to shorten the distance of the interconnecting wire between the input and output nodes of the opposite inverters of the flip-flop making up the cell. Such short and compact connection layouts are generally termed "local interconnects." There are three known methods often used to form local interconnects for ULSI chip applications. They are (1) forming directly-reacted titanium nitride (TiN) local interconnects during the normal titanium silicidation portion of the integrated circuit fabrication process, (2) forming a silicide local interconnect by depositing and patterning a composite material, and (3) forming a local interconnect with a buried contact.

In the directly-reacted method for forming a TiN local interconnect, a titanium layer is deposited on the semiconductor device and then heated. During the heat process, titanium in contact with the moat areas of the device forms a bilayer of titanium silicide covered with titanium nitride. Titanium in contact with oxide regions of the device forms titanium nitride. A titanium nitride film is retained to form the local interconnect through a combination of wet chemical and dry plasma etch steps with a photoresist pattern. While this process is simple, it suffers from poor manufacturing yield. This is because the dry plasma etch step of the process in which the titanium nitride is removed does not have enough selectivity to the titanium silicide areas to avoid some undesirable etching of the titanium silicide moat and polysilicon regions of the device. The lack of sufficient selectivity requires that the etch time be kept short. Even so, the low selectivity of the dry plasma etch step thins the titanium silicide on the moat and polysilicon areas of the device.

Because no vigorous full strength wet chemical etch can be used to remove the titanium nitride from undesired areas, it is inevitable that some conductive titanium nitride or titanium oxide compounds can be left which can electrically connect minimum spaced active areas that should be electrically isolated. To minimize this possibility, the titanium deposition thickness and resulting titanium nitride thickness must be limited. Additionally, to remove the residual titanium nitride filament material from sidewall oxide edges, it is necessary to perform a wet chemical etch with a mixture of diluted ammonium hydroxide and hydrogen peroxide in a sonic environment.

The wet etch is a messy and time-consuming step, which, if it were possible to avoid, could significantly increase local interconnect formation process throughput. Additionally, the sonic energy and filament's tenacity, often leave no margin for the photoresist to work. This often results in a total loss of the desired local interconnect features due to lifting photoresist. To alleviate to some extent this photoresist adherence problem, it is necessary to separate the wet etch into two steps in which the photoresist is stripped after the first etch and re-patterned and the etch completed. This adds another lithographic patterning step (so called double patterning) which further complicates the process.

in forming a silicide local interconnect (i.e., the second often-used method), composite material is deposited and patterned to form a silicided local interconnect. The most commonly used silicide materials are tungsten and titanium. By mixing tungsten and titanium with a sputtered silicon layer, this process forms a conductive silicide local interconnect. Sputtered silicon is necessary to prevent junction spiking during the silicidation process. Sputtered titanium nitride may be used by itself for such an application. This approach, however, suffers from the same low selectivity problems that plague the dry etch of directly-reacted titanium nitride local interconnect process and poses the same filament problem of that process. As such, mass production using the silicide local interconnect has limited potential.

The third known method to form an integrated circuit local interconnect is to form a local interconnect with a buried contact. In this method, a layer of oxide is deposited and contact holes are defined prior to the local interconnect material deposition. Having this oxide layer may overcome the dry etch low selectivity problem. However, the step of making the buried contact adds significantly to fabrication costs and limits the chip design size. This is due to the required alignment tolerances between the buried contact and moat and the buried contact and the local interconnect.

Accordingly, there is a need for a method to form a local interconnect for integrated circuit applications such as ULSI circuit chips that avoids thinning of the titanium silicide in the moat and polysilicon regions due to a low selectivity dry plasma etch step necessary to form the local interconnect.

There is a need for a method that avoids the requirement to wet etch the structure associated with the local interconnect following the dry plasma etch step of the local interconnect forming process.

There is a need for a method of forming a local interconnect for an integrated circuit that does not impose limitations on the local interconnect material layer thickness.

There is a further need for a method of forming a local interconnect for an integrated circuit that avoids the double patterning process of conventional local interconnect forming methods.

There is yet the need for a method that permits use of a full strength wet strip process following the formation of the local interconnect.

SUMMARY OF THE INVENTION

The present invention, accordingly, provides a titanium tungsten local interconnect for an integrated circuit and method for forming same that overcomes or reduces disadvantages and limitations associated with prior local interconnects and methods for forming local interconnects.

One aspect of the invention is a method for forming a local interconnect for an integrated circuit on a semiconductor structure. The local interconnect forming method of the present invention takes place after titanium silicide formation in the semiconductor device moat and polysilicon region. Steps of the present invention include sputtering a titanium tungsten (TiW) layer on the semiconductor structure and then forming a tungsten layer over the TiW layer. Then, the method includes the step of patterning a layer of resistive polymer such as photoresist in a predetermined lithographic pattern on the chip. This is to form the local interconnect on the tungsten layer. Then, by first dry etching exposed portions of the tungsten layer, and the TiW layer, and then stripping the resistive polymer from the semiconductor structure, the method yields a TiW interconnect for the integrated circuit.

A technical advantage of TiW process of the present invention is that it is cost effective, easy to manufacture, reliable and compatible with existing fabrication processes and existing fabrication environments. In fact, the method of the present invention may be easily adapted as a direct substitute for all existing local interconnect formation processes that use metallic material.

Another technical advantage of the present invention is that it avoids the thinning of the titanium silicide layer in the moat and polysilicon areas that is typical of the directly-reacted titanium nitride local interconnect forming process.

Another technical advantage of the present invention is that it avoids the requirement to perform a wet etch following the local interconnect dry plasma etch process that is typical of conventional local interconnect forming methods. As a result, the local interconnect forming process of the present invention is faster, cleaner, and more reliable than prior local interconnect forming processes. Linewidth dimensions of the local interconnect are also better controlled by using an all dry etch.

Yet another technical advantage of the present invention is that the conventional titanium silicide formation for the integrated circuit is decoupled from the local interconnect formation process. This avoids restrictions on the initial titanium deposition thickness used to form the titanium silicide. As a result the titanium thickness can be selected to minimize diode leakage while maintaining sufficient moat and polysilicon sheet resistance.

Another technical advantage of the present invention is that only one lithographic patterning step is necessary with the present invention. This avoids the time-consuming double patterning process typical of conventional local interconnect forming methods.

Another technical advantage of the present invention is that, because the silicide formation is decoupled from the local interconnect forming process, it is possible to do a full strength wet strip after the titanium silicide formation step that will not adversely affect the local interconnect. Prior methods and resulting local interconnects suffer from degradation of the local interconnect if a full strength wet strip is performed. This is not a problem with the present invention.

Yet another technical advantage of the present invention is that no ozone-depleting gases are used in the dry plasma etch of the present invention. This makes the process of the present invention much more environmentally attractive than conventional local interconnect forming processes.

BRIEF DESCRIPTION OF THE DRAWINGS

The invention and its modes of use and advantages are best understood by reference to the following description of illustrative embodiments when read in conjunction with the accompanying drawings, wherein.

DETAILED DESCRIPTION OF THE INVENTION

The preferred embodiment of the present invention is best understood by referring to the FIGUREs wherein like numerals are used for like and corresponding parts of the various drawings.

The preferred embodiment features the use of sputtered TiW and tungsten layers for the local interconnect forming material and the use of a plasma dry etch to define the local interconnect structure. The dry etch used has a good selectivity to titanium silicide so there is no loss of $TiSi_2$ during the plasma etch. The TiW and tungsten layer conducts better than the TiN that conventional local interconnects use. Also, the TiW and tungsten layer has minimal interaction with the silicon when making ohmic contact at temperatures common to the manufacturing process flow at the metallization. This makes the photoresist patterning the limiting process step for the local interconnect process. In other words, the local interconnect process for the preferred embodiment is as good as what the patterning technology can provide.

An alternate embodiment of the present invention uses a single sputtered TiW layer for the local interconnect forming material and employs a hydrogen peroxide wet etch to define the local interconnect structure. The TiW sputtering step provides an excellent surface to which photoresist can adhere. Moreover, TiW is well-behaved in hydrogen peroxide. With a typical thickness of 450 to 1,000 Å, TiW can be delineated in hydrogen peroxide without losing the local interconnect line width for several minutes. The wet etch provides an almost infinite selectivity to silicon so that there is no loss of silicon junctions due to the wet etch's selectivity.

Figure 1:
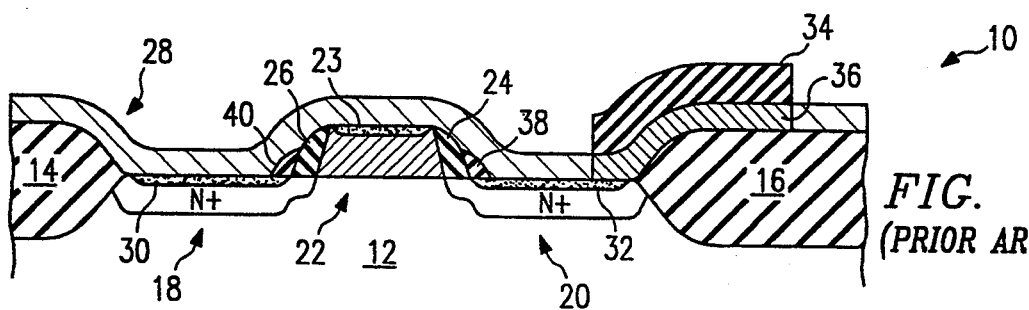
FIG. 1 illustrates a conventional method of local interconnect formation to illustrate the problem that the preferred embodiment addresses.

FIG. 1 shows, for the purposes of comparison, the results of the conventional local interconnect formation process that directly reacts titanium on top of the oxide structures of the semiconductor device to form titanium nitride during the regular titanium silicide formation process. In particular, cell 10 includes silicon substrate 12 having silicon oxide isolation structures 14 and 16 and N+-channel moats 18 and 20. During the titanium deposition process, titanium is deposited over silicon oxide isolation structures 14 and 16, N+-channel moats 18 and 20, and polysilicon gate structure 22 that has sidewalls 24 and 26. After the furnace reaction process, the titanium layer 28 forms a bilayer of titanium silicide covered with titanium nitride, regions 30 and 32 in moat regions 18 and 20 and titanium silicide covered with titanium nitride region 23 in polysilicon gate region 22 and titanium nitride over silicon oxide regions 14 and 16.

To form a titanium nitride local interconnect, the conventional process is to pattern photoresist layer 34 over titanium nitride layer 28. After which, titanium nitride layer 28 will be removed leaving only that portion 36 beneath photoresist pattern layer 34. Because the dry etch for removing the titanium nitride layer is not sufficiently selective to avoid removing the titanium silicide layers 30, 32 and 23 process parameters must be carefully defined. In particular, the low titanium silicide selectivity of the dry etch for removing titanium nitride layer 28 can reduce the thickness of titanium silicide layers 30, 32 and 23. As a result, the time for the dry etch to remove titanium nitride layer 28 must be carefully controlled. Additionally, because the time period for removing titanium nitride layer 28 is restricted in the conventional method, filaments of titanium nitride or titanium oxide compounds 38 and 40 may appear between sidewalls 24 or 26 and titanium silicide layers 30 and 32. The conventional method is also time consuming because it requires a wet etch as well as double patterning of the local interconnect. Furthermore, once the titanium nitride local interconnect is formed, it is not possible to do a wet strip of cell 10 following titanium nitride formation.

The preferred embodiment of the present invention avoids these limitations by not only decoupling the titanium silicide formation from the local interconnect formation process, but also using an improved method and material for forming the local interconnect. In the preferred embodiment, no thinning of the titanium silicide layer in the moat and polysilicon regions results and no wet etch is necessary to remove filaments of titanium nitride and titanium oxide between the gate structure sidewalls and the moat region. Additionally, only one pattern step is necessary in the preferred embodiment because only one dry etch is used. Because the titanium silicide formation portion of the cell formation process is decoupled from the local interconnect process, it is possible to do a full strength wet strip process after the titanium silicide formation. This removes all unwanted titanium nitride and titanium oxide filaments leaving only region of titanium silicide. An added advantage of the preferred embodiment is that by avoiding the need to dry etch a titanium nitride layer, the preferred embodiment does not use a carbon tetrachloride etch gas. The carbon tetrachloride gas, however, is known to be ozone-depleting. By avoiding the use of ozone-depleting gases, the preferred embodiment is beneficial to the environment relative to the conventional methods for forming local interconnects.

Figure 2:
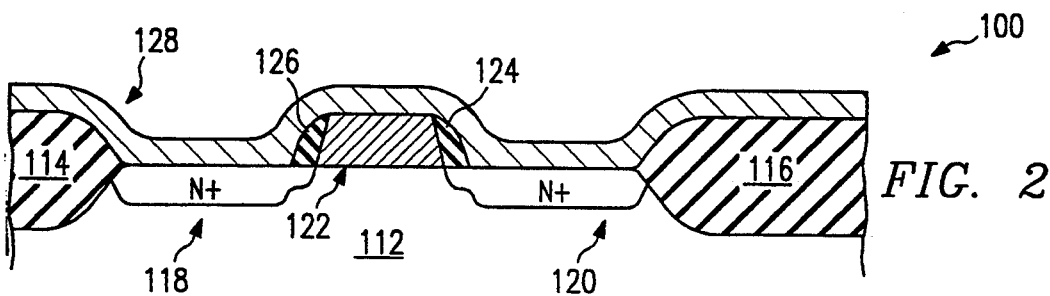
FIGS. 2 through 4 illustrate the various stages of performing the process flow of the preferred embodiment.
Figure 3:
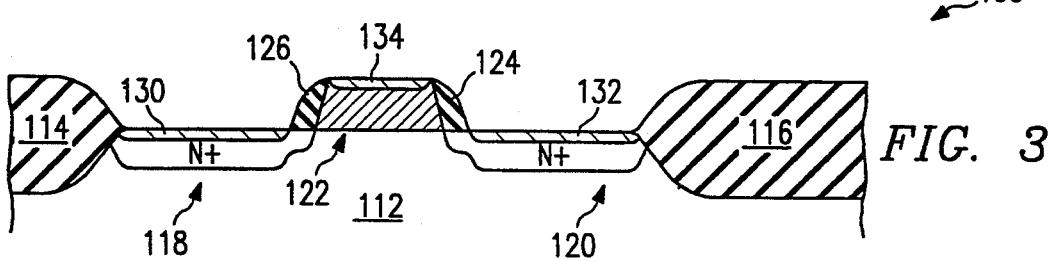
Figure 4:
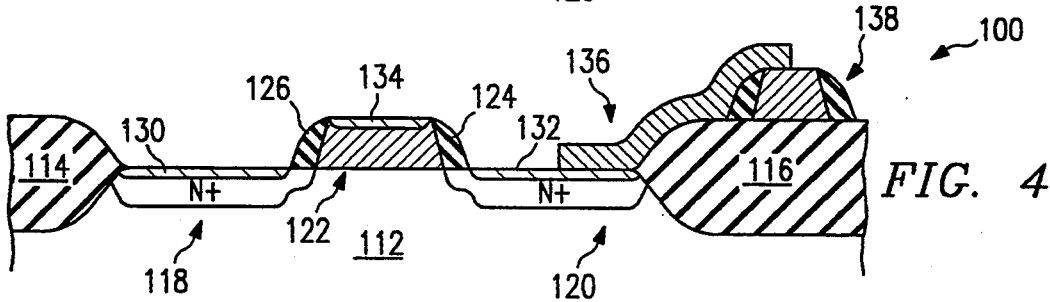

FIGS. 2 through 4 illustrate the method and resulting structure of the preferred embodiment. Beginning at FIG. 2, there is shown cell or device 100 that includes silicon substrate 112 having isolation structures 114 and 116. Between isolation structures 114 and 116 are N+-channel regions 118 and 120 that respectively associate with sidewalls 124 and 126 of polysilicon gate structure 122. This is the same structure for beginning the silicide and local interconnect forming steps of the prior art.

The first step of the process of the preferred embodiment as FIG. 2 illustrates is to deposit titanium layer 128 as a first covering of device structure 100. The process of the preferred embodiment deposits titanium layer 128 to a thickness of between 800 and 1,000 Å. In an argon/-nitrogen process environment for approximately 30 minutes at a temperature at approximately 675° C. and while the titanium layer 128 covers N+-channel regions 118 and 120, a titanium silicide (TiSi$_2$) layer forms into layers 130 and 132 in the moat regions and layer 134 in the gate region. A titanium nitride layer forms on top of the titanium silicide layer and over the oxide isolation structures. To remove the top titanium nitride layer 128 and any TiN on the oxide isolation structure, the preferred embodiment performs what is called a "piranha" wet etch of H$_2$SO$_4$ and H$_2$O$_2$ and a wet strip using NH$_4$OH and H$_2$O$_2$. FIG. 3 illustrates the structure resulting from this stage of the process flow.

Upon removing the titanium nitride layer, the preferred embodiment of the present invention sputters a layer of approximately 225 Å of titanium tungsten (TiW). Next, the preferred embodiment sputters deposits, for example, by way of chemical vapor deposition process, a layer of tungsten (W) (not shown) having a thickness of between 450 and 700 Å. Then, to form the local interconnect pattern, the process applies a thickness of approximately 9500 Å of a photoresist such as that sold under the name SHIPLEY 810DL. The photoresist covering the portions of the TiW and W layers for local interconnects are patterned in a conventional direct step-on-wafer machine such as Nikon DSW. Then, for the exposed portions of the TiW and W layers, the process includes a dry etch step that uses SF$_6$/N$_2$ process etch gas at a substrate temperature of 30° C. The SF$_6$/N$_2$ process etch gas has the advantage of being fully selective to etch the TiW and W layers while avoiding detrimental affects to the TiSi$_2$ layers 130, 132 and 134 that are already part of device 100. The dry etch process environment is also non-ozone depleting, in contrast to the CCl$_4$ dry etch environment of the conventional dry etch process.

The process continues with a wet strip step to strip away the photoresist and leave exposed the desired structure of the local interconnect. In the preferred embodiment, the wet strip for removing the SHIPLEY 810DL photoresist is a compound known commonly as ST-22. This is done in a process environment of approximately 120° C.

The next steps of the process for forming structure 100 are typical of prior art processes and may include an oxide deposition process for depositing 11,000 Å of silicon dioxide via plasma enhanced chemical vapor deposition (PECVD) at a process temperature of approximately 320° C. Then, a resist-etch back (REB) process for depositing approximately 5,000 Å photoresist is followed by a blanket etch back in a plasma reactor environment of CF$_4$ plasma. The next step is to form a 1,000 Å TEOS (i.e. tetraethyloxysilicate) layer in a process environment of approximately 720° C. followed by a phospho-silicate glass (PSG) deposition process to form a PSG layer of approximately 4,000 Å. Additionally, the method of the preferred embodiment performs a PSG anneal step at 700° C. in a nitrogen environment.

FIG. 4 provides a conceptual cut-away diagram of the local interconnect that the above-described preferred embodiment provides. On silicon substrate 112 appears isolation structures 114 and 116 and N+-channel 118 and 120 beneath gate structure 122. Sidewalls 124 and 126 surround gate structure 122. N+-channel regions 118 and 120, as well as the inner top portion of gate structure 126, are covered by a titanium silicide layer 130, 132 and 134, respectively. Depending on how they are electrically connected, N+-channel regions 118 and 120 may serve as source or drain connections. Above and connected to titanium silicide layer 132 and over isolation region 116 appears TiW local interconnect 136 that was formed according to the process of the preferred embodiment. Local interconnect 136 may connect to yet another polysilicon interconnect structure such as structure 138, according to the design of cell 100.

Figure 5:
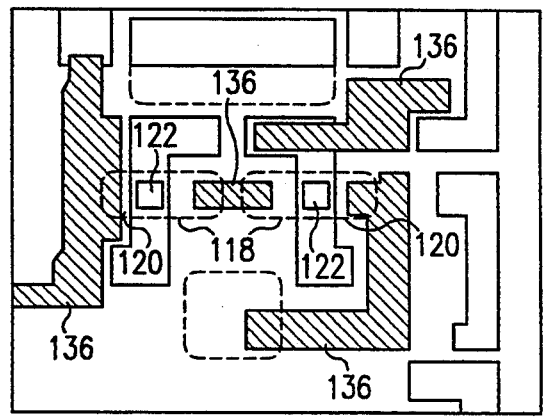
FIG. 5 provides a drawing taken from a photomicrograph of an integrated circuit portion to illustrate the local interconnect formation method according to the preferred embodiment.

FIG. 5 illustrates a drawing taken from a photomicrograph to show the local interconnect configuration of the preferred embodiment. In particular, FIG. 5 shows various local interconnects all labeled as 136 connecting to various source connections labeled 118 and drain connections labeled 120. Source connections 118 and drain connections 120 connect to gate structures 122 as illustrated in the photomicrograph-based conceptual drawing of FIG. 5.

Although the invention has been described with reference to the above specific embodiments, this description is not meant to be construed in a limiting sense. Various modifications of a disclosed embodiment, as well as alternative embodiments of the invention, will become apparent to persons skilled in the art upon reference to the above description. It is, therefore, contemplated that the appended claims will cover such modifications that fall within the true scope of the invention.

What is claimed is:

1. A method for forming a local interconnect for a cell of a semiconductor structure, comprising the steps of:

forming a titanium silicide layer on a plurality of moat and polysilicon regions of said semiconductor structure;

depositing a TiW layer on said semiconductor structure and said titanium silicide layer;

depositing a tungsten layer on said semiconductor structure and said TiW layer;

patterning a layer of resistive polymer in a predetermined lithographic pattern over said tungsten layer and said TiW layer for a local interconnect on said tungsten layer;

dry etching said semiconductor structure using an etchant which removes exposed portions of said TiW and tungsten layers while avoiding etching said titanium silicide layer;

wet etching said resistive polymer to remove said polymer from said semiconductor structure and to yield therefrom a local interconnect for said cell.

2. The method of claim 1, wherein said TiW layer depositing step further comprises the step of depositing approximately 225 Å of a TiW layer using a sputtering fabrication process.

3. The method of claim 1, wherein said tungsten layer depositing step further comprises the step of sputtering a layer of tungsten to a thickness of 450 to 700 Å over said TiW layer.

4. The method of claim 1, wherein said tungsten layer depositing step further comprises the step of depositing a layer of tungsten to a thickness of approximately 450 and 700 Å using a chemical vapor deposition process.

5. The method of claim 1, wherein said resistive polymer patterning step comprises the step of forming an approximately 9500 Å resistive polymer layer in a pattern having the shape of a local interconnect over said TiW/tungsten layer or single TiW layer.

6. The method of claim 1, wherein said dry etching step further comprises the step of dry etching said exposed portions of said TiW layer using a $SF_6/N_2$ process environment at a temperature of approximately 30° C.

7. The method of claim 1, wherein said wet etching step further comprises the step of striping resistive polymer layer from said semiconductor structure.

8. The method of claim 1, wherein said step of forming a titanium silicide layer on said semiconductor structure comprises depositing a layer of titanium over said moat and polysilicon regions.

9. The method of claim 8, wherein said titanium layer used for forming said titanium silicide areas on said moat regions is removed using a wet etch step followed by a wet strip step.

* * * * *